United States Patent
Bedell et al.

(10) Patent No.: US 8,860,005 B1
(45) Date of Patent: Oct. 14, 2014

(54) THIN LIGHT EMITTING DIODE AND FABRICATION METHOD

(71) Applicant: International Business Machines Corporation, Armonk, NY (US)

(72) Inventors: Stephen W. Bedell, Wappingers Falls, NY (US); Bahman Hekmatshoartabari, White Plains, NY (US); Devendra K. Sadana, Pleasantville, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/962,564

(22) Filed: Aug. 8, 2013

(51) Int. Cl.
 *H01L 29/06* (2006.01)
 *H01L 33/06* (2010.01)
 *H01L 33/10* (2010.01)

(52) U.S. Cl.
 CPC .......... *H01L 33/10* (2013.01); *H01L 33/06* (2013.01)
 USPC ........................................................ 257/13

(58) Field of Classification Search
 CPC .............................................. H01L 21/02697
 USPC ............... 257/88–89, 98–99, 103, E33.067, 257/E21.211; 438/2, 29, 31, 33, 96, 462
 See application file for complete search history.

(56) References Cited

U.S. PATENT DOCUMENTS

| 7,118,930 B1 | 10/2006 | Wuu et al. |
| 8,063,410 B2 | 11/2011 | Fudeta |
| 8,319,243 B2 | 11/2012 | Fudeta |
| 2010/0264843 A1 | 10/2010 | Herrmann |
| 2010/0307572 A1 | 12/2010 | Bedell et al. |

FOREIGN PATENT DOCUMENTS

| JP | 2012138638 A | 7/2012 |
| JP | 2012138639 A | 7/2012 |
| KR | 1020060039762 A | 5/2006 |

OTHER PUBLICATIONS

Compoundsemiconductor. "Reflecting layer boosts LED brightness" www.compoundsemiconductor.net. Apr. 2009. (6 Pages) Available at: http://www.compoundsemiconductor.net/csc/features-details/37883/Reflecting-layer-boosts-LED-brightnes.html.

*Primary Examiner* — Mark A Laurenzi
(74) *Attorney, Agent, or Firm* — Tutunjian & Bitetto, P.C.; Louis J. Percello

(57) ABSTRACT

A method for fabrication a light emitting diode (LED) includes growing a crystalline LED structure on a growth substrate, forming alternating material layers on the LED structure to form a reflector on a back side opposite the growth substrate and depositing a stressor layer on the reflector. A handle substrate is adhered to the stressor layer. The LED structure is separated from the growth substrate using a spalling process to expose a front side of the LED structure.

16 Claims, 10 Drawing Sheets

THIN LIGHT EMITTING DIODE AND FABRICATION METHOD

BACKGROUND

1. Technical Field

The present invention relates to light emitting diode (LED) structures and methods, and more particularly to thin LEDs made by wafer splitting growth substrates employed in growing the LEDs.

2. Description of the Related Art

GaN-based light-emitting diodes (LEDs) are becoming mainstream as they can provide emitted light wavelengths for general lighting applications, medical applications, etc. However, growth substrates on which LED structures are grown are expensive. In addition to substrate reuse, potentially superior performance of thin LED devices has been a main driving force for selecting thin LED structures over other LED types. For example, more effective heat dissipation strategies can be employed to improve the lifetime of thin LEDs. To improve the intensity of the emitted light in thin LEDs, distributed Bragg reflectors (DBR) and/or texturing of the starting substrate have been employed.

SUMMARY

A method for fabrication a light emitting diode (LED) includes growing a crystalline LED structure on a growth substrate, forming alternating material layers on the LED structure to form a reflector on a back side opposite the growth substrate and depositing a stressor layer on the reflector. A handle substrate is adhered to the stressor layer. The LED structure is separated from the growth substrate using a spalling process to expose a front side of the LED structure.

Another method for fabricating a light emitting diode (LED) includes growing a crystalline LED structure on a growth substrate; forming alternating material layers on the LED structure to form a reflector on a back side opposite the growth substrate; patterning the reflector to form openings in the reflector; depositing a stressor layer on the reflector and in the openings to form localized contacts; adhering a handle substrate to the stressor layer; and separating the LED structure from the growth substrate using a spalling process to expose a front side of the LED structure.

A light emitting diode (LED) includes a crystalline LED structure including a plurality of alternating crystalline layers, a distributed Bragg reflector (DBR) formed on a back side of the LED structure and including alternating material layers and a stressor layer formed on the reflector. A substrate is adhered to the stressor layer. A conductive material is formed on a front side of the LED structure such that the front side is configured to permit emission of light.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
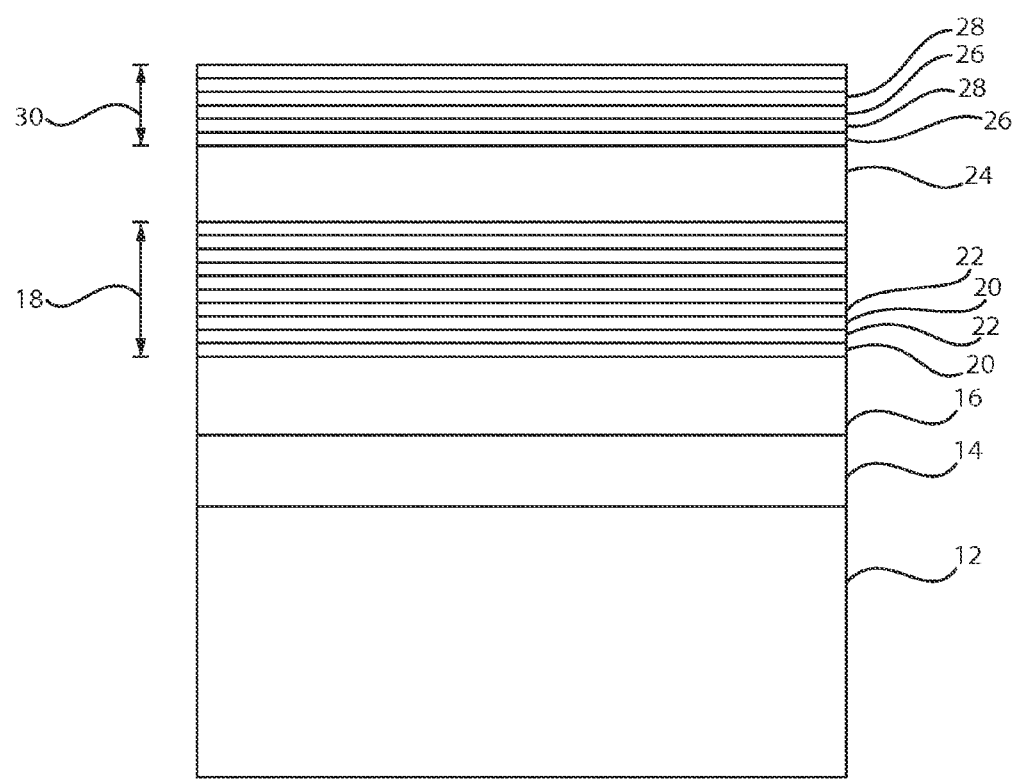
FIG. 1 is a cross-sectional view of a light emitting diode structure formed on a buffer layer which is formed on a growth substrate in accordance with the present principles.

In accordance with the present principles, light emitting diode structures are provided with high quality back reflectors which may be formed on a stressor layer and handle substrate. The stressor layer is also employed to induce stress for the removal a growth substrate in the fabrication process. The reflectors preferably include distributed Bragg reflectors (DBRs) and/or dielectric reflectors which are grown on top of the LED structure prior to the removal of the LED structure from the growth substrate. The removal of the growth substrate is preferably performed using a mechanical splitting process, e.g., using controlled spalling technology.

It is to be understood that the present invention will be described in terms of a given illustrative architecture having a wafer or substrate for forming LEDs; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In accordance with some embodiments, a design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., AlGaN, GaN, InGaN, etc. These compounds may include different proportions of the elements within the compound, e.g., InGaN includes $In_xGa_{1-x}N$, where x, is less than or equal to 1, or AlGaN includes $Al_xGa_{1-x}N$ where x is less than or equal to 1, etc. In addition, other elements may be included in the compound, such as, e.g., AlInGaN, and still function in accordance with the present principles. The compounds with additional elements will be referred to herein as alloys.

The present embodiments may be part of a device or circuit, and the circuits as described herein may be part of a design for an integrated circuit chip, a display device, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an illustrative LED structure 10 is shown in accordance with one illustrative embodiment. The LED structure 10 includes a growth substrate 12, which may include any number of monocrystalline substrate materials. In some embodiments, the growth substrate 12 may include III-nitrides (GaN, InN, AlN, etc.), III-arsenides, III-phosphides, sapphire, silicon, etc. A buffer layer 14 may be epitaxially grown on the growth substrate 12 and can be grown using the same material or a different monocrystalline material with a nearly similar lattice constant (e.g., AlN or GaN).

A first contact layer 16 includes a doped crystalline material that may be epitaxially grown on the buffer layer 14. In one embodiment, the contact layer 16 includes GaN. The GaN of the contact layer 16 can also act as a buffer (buffer layer 16 may be omitted) as well as a contact layer. A superlattice or alternating layer stack 18 is formed on the first contact layer 16. The stack 18 may include a multiple quantum well (MQW) structure.

The stack 18 preferably includes a multiple quantum well (MQW) structure that may include alternating layers of InGaN and GaN or alternating layers of AlGaN and (In)GaN or alternating layers of AlGaN and GaN, wherein the wider gap material serves as the barrier and the narrower gap material acts as the well. The composition and the thickness of both the barrier and the well are engineered to adjust the wavelength of the emitted light. Other materials may also be employed. The layers 20, 22 of stack 18 may be about 3-9 nm per GaN/InGaN period. Usually, multiple periods are used for higher power devices, e.g., 3 to 8 periods are common, making the stack 18 thickness as thick as, e.g., 100 nm.

The layers 20, 22 of stack 18 may be crystalline and epitaxially grown. A second contact layer 24 includes a doped crystalline epitaxially grown material having an opposite dopant conductivity than the first contact layer 16. The contact layers 16 and 24 may respectively include n-doped GaN and p-doped GaN. The contact layers 16 and 24 may be about 500 nm thick but can be made any thickness, e.g., if thinner, the contact layers 16 and 24 need to have a higher doping concentration. Dependent upon the application, thinner contact layers 16 and 24 can enable higher light extraction as well.

A back reflector 30 is formed on the second contact layer 24. The reflector 30 may include a distributed Bragg reflector (DBR), which is a reflector formed from multiple layers of alternating materials 26, 28 with varying refractive index, or by periodic variation of some characteristic (such as height) of a dielectric waveguide, resulting in periodic variation in the effective refractive index in the guide. Each boundary of layers 26, 28 causes a partial reflection of an optical wave. The reflections combine with constructive interference, and the layers 26, 28 act as a high-quality reflector. In illustrative examples, the layers 26, 28 may include material combinations of, e.g., AlGaN/GaN, $TiO_2/SiO_2$, $Al_2O_3/SiO_2$, etc. In one embodiment, the reflector layers 26, 28 include dielectric materials. In other embodiments, the reflective layers 26, 28 may include doped semiconductor materials, e.g., AlGaN/GaN forming, e.g., p+ DBR or n+ short super-lattice reflectors. Multiple reflectors may also be employed together.

Figure 2:
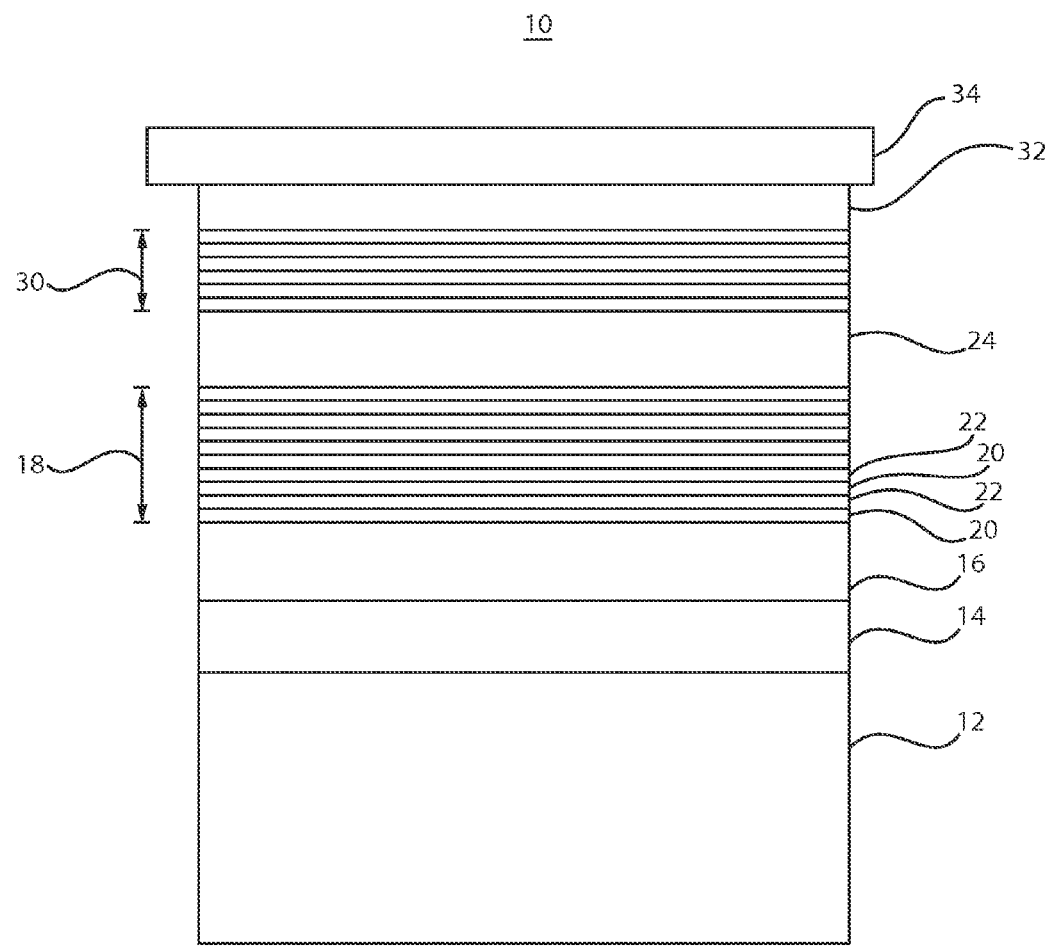
FIG. 2 is a cross-sectional view of the light emitting diode structure of FIG. 1 having a reflector, stressor layer and handle substrate formed thereon in accordance with the present principles.

Referring to FIG. 2, a stressor layer 32 is formed on the reflector 30. Thin reflective metal (20 nm-500 nm) such as Au, Al, or Ag may be deposited on the reflector prior to the deposition of the stressor layer 32. The stressor layer 32 may include a metal, or a dielectric material. For example, the stressor layer 32 may include Ni, organic materials, etc. The stressor layer 32 is preferably a tensile stressor layer to induce stress for spalling the growth substrate 12 as will be described. The stressor layer 32 is preferably a metal between about 2 to about 100 microns thick. A flexible handle substrate 34 is adhered to the stressor layer 32. The flexible handle substrate 34 may include any substrate material suitable for supporting the stressor layer 32 and assisting in wafer splitting. The flexible handle substrate 34 may include a polymer, a ceramic, or other material.

Figure 3:
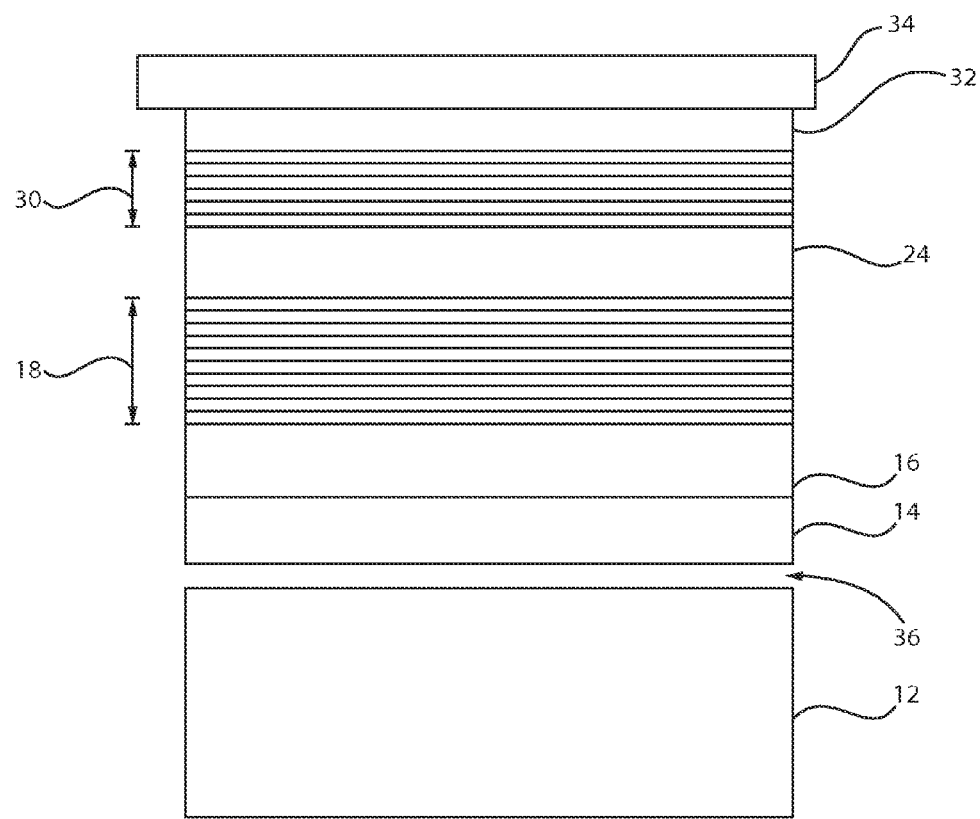
FIG. 3 is a cross-sectional view of the light emitting diode structure of FIG. 2 showing the growth substrate removed from the buffer layer using spalling and the stress induced by the stressor layer in accordance with the present principles.

Referring to FIG. 3, the growth substrate 12 may be split off or otherwise reduced using controlled spalling. In a particularly useful embodiment, spalling offers a relatively inexpensive, low-temperature method for splitting the growth substrate 12. Shear stress is applied using the flexible handle substrate 34 and the applied stress due to the stressor layer 32 to split the growth substrate 12 along a fracture line 36. The fracture line 36 preferably includes an interface between the growth substrate 12 and the buffer layer 14, if employed or the contact 16 if the buffer layer is not employed.

Figure 4:
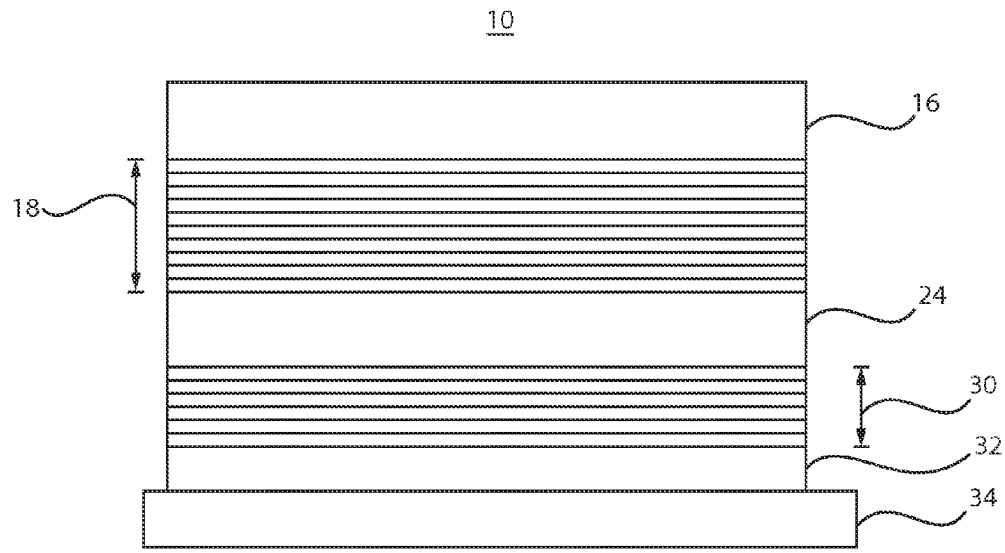
FIG. 4 is a cross-sectional view of the light emitting diode structure of FIG. 3 showing the buffer removed in accordance with the present principles.

Referring to FIG. 4, the device 10 is flipped after removing the growth substrate 12. The buffer layer 14, if employed, is now removed by one or more of etching, polishing, grinding, etc. For a dry etch, a chlorine based chemistry, etc. may be employed to remove the buffer layer 14 (and any remaining portion of the growth substrate 12) down to the contact 16. The stressor layer 32 remains as a portion of the device 10 and, if conductive, acts as a portion of the back contact of the device 10.

Figure 5:
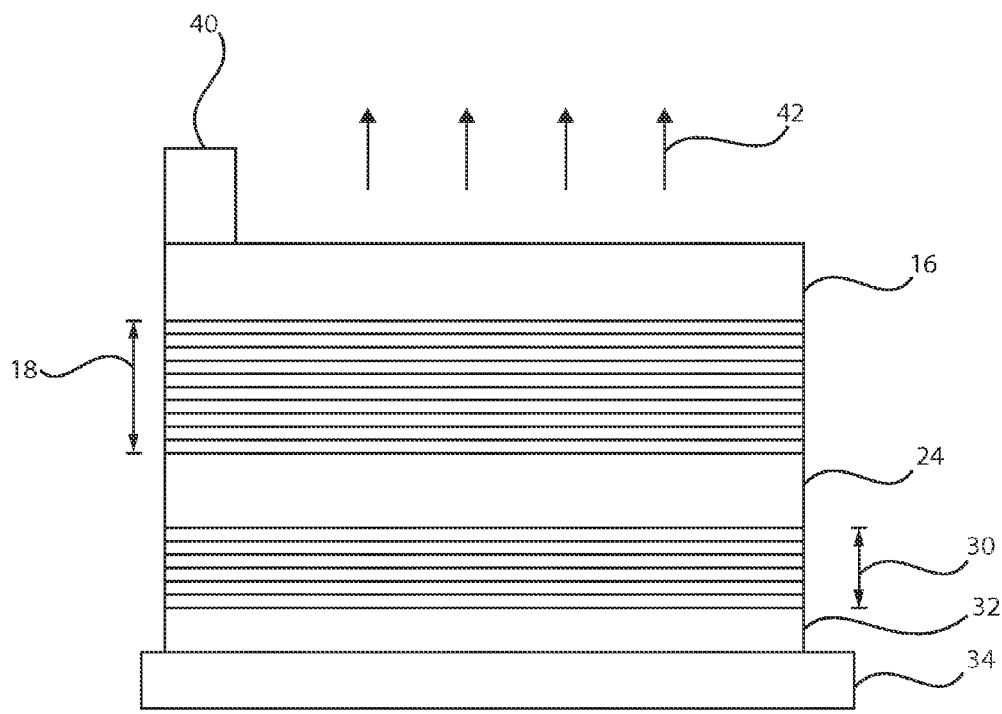
FIG. 5 is a cross-sectional view of the light emitting diode structure of FIG. 4 showing a metal electrode patterned on the LED structure in accordance with the present principles.

Referring to FIG. 5, an optional transparent passivation layer (not shown) may be deposited and patterned. A front metal grid 40 may be deposited and patterned on the contact 16. The metal grid 40 may form a portion of the front contact 16. During operation the device 10, which includes, an LED or thin LED, light 42 is emitted from the front face (contact 16).

Figure 6:
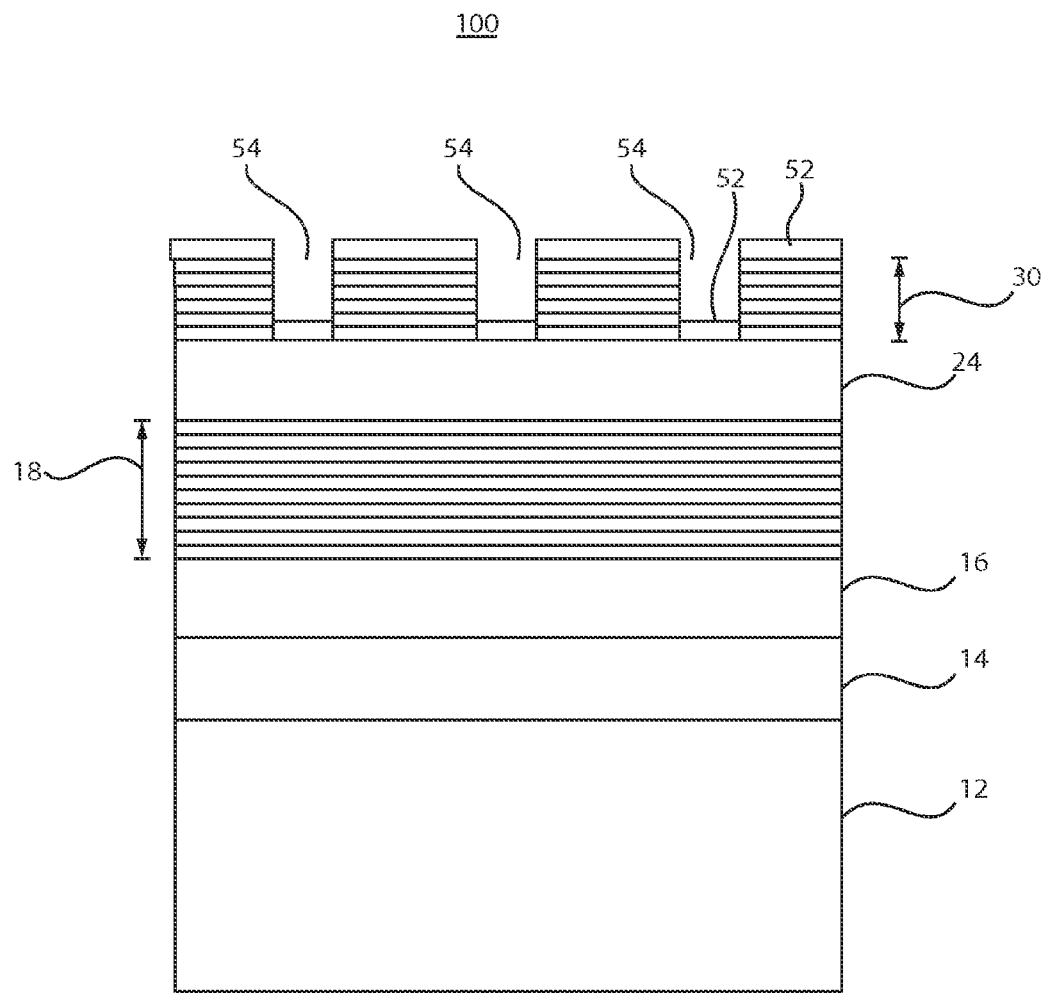
FIG. 6 is a cross-sectional view of a light emitting diode structure formed on a buffer layer which is formed on a growth substrate and showing a reflector patterned and a metal layer formed on and in openings of the reflector in accordance with the present principles.

Referring to FIG. 6, beginning with the LED device structure of FIG. 1, the back reflector 30 of device 100 is patterned by forming a mask (not shown) and etching trenches or holes 54 therein. The etching process may include a reactive ion etch or other suitable etching process. The mask may be removed by known processes. The reflector 30 may include dielectric layers 26, 28. In one embodiment, the dielectric layers 26, 28 include $Al_2O_3$ and $SiO_2$, although other materials may be employed. The dielectric layers 26, 28 may be formed by employing, e.g., a plasma enhanced chemical vapor deposition (PECVD) process. A metal layer 52 is selectively deposited on horizontal surfaces or may be conformally deposited and etched to remove metal from vertical surfaces to form localized contacts. Other processes may be employed. The metal layer 52 may include Au, Al, Ag or any other suitable conductor.

Figure 7:
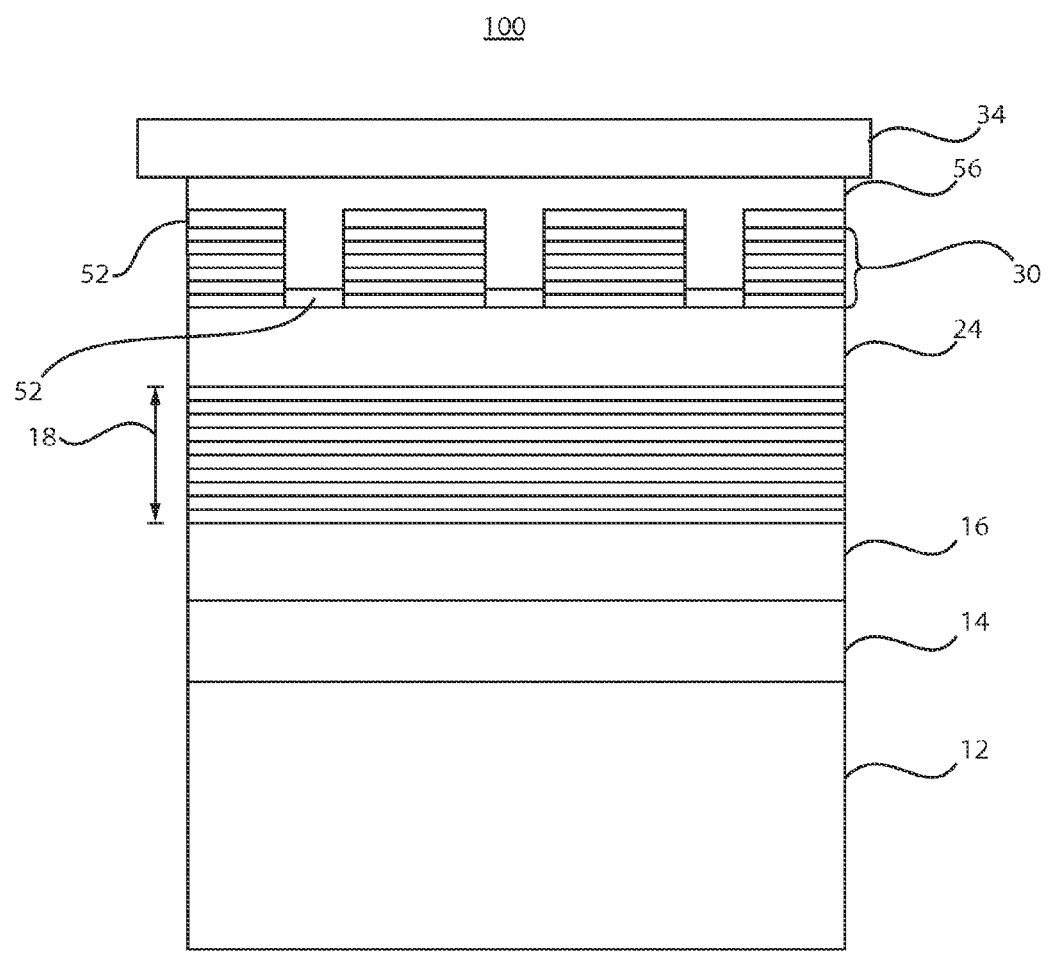
FIG. 7 is a cross-sectional view of the light emitting diode structure of FIG. 6 having a stressor layer formed on the reflector and in the opening in the reflector and a handle substrate formed thereon in accordance with the present principles.

Referring to FIG. 7, a stressor layer 56 is formed on the metal layer 52 and fills trenches or holes 54. The stressor layer 56 may include a metal, or a dielectric material. For example, the stressor layer 56 may include Ni, organic materials, etc. The stressor layer 56 is preferably a tensile stressor layer to induce stress for spalling the growth substrate 12 as will be described. The stressor layer 56 is preferably a metal between about 2 to about 100 microns thick. A flexible handle substrate 34 is adhered to the stressor layer 56. The flexible handle substrate 34 may include any substrate material suitable for supporting the stressor layer 56 and assisting in wafer splitting. The flexible handle substrate 34 may include a polymer, a ceramic, or other material.

Figure 8:
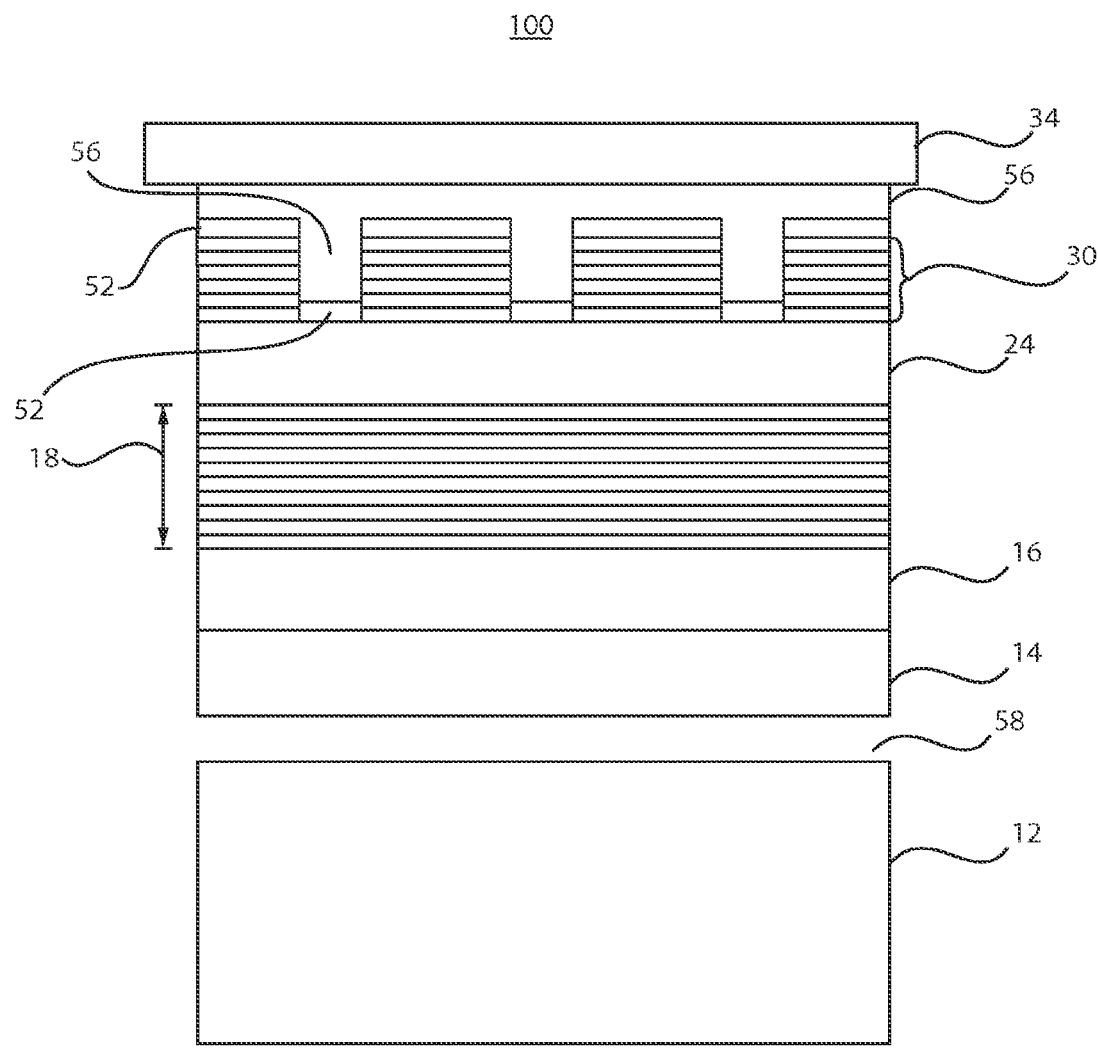
FIG. 8 is a cross-sectional view of the light emitting diode structure of FIG. 7 showing the growth substrate removed from the buffer layer using spalling and the stress induced by the stressor layer in accordance with the present principles.

Referring to FIG. 8, the growth substrate 12 may be split off or otherwise reduced using the controlled spalling. In a particularly useful embodiment, spalling offers a relatively inexpensive, low-temperature method for splitting the growth substrate 12. Shear stress is applied using the flexible handle substrate 34 and the applied stress due to the stressor layer 56 to split the growth substrate 12 along a fracture line 58. The fracture line 36 preferably includes an interface between the growth substrate 12 and the buffer layer 14, if employed or the contact 16 if the buffer layer is not employed.

Figure 9:
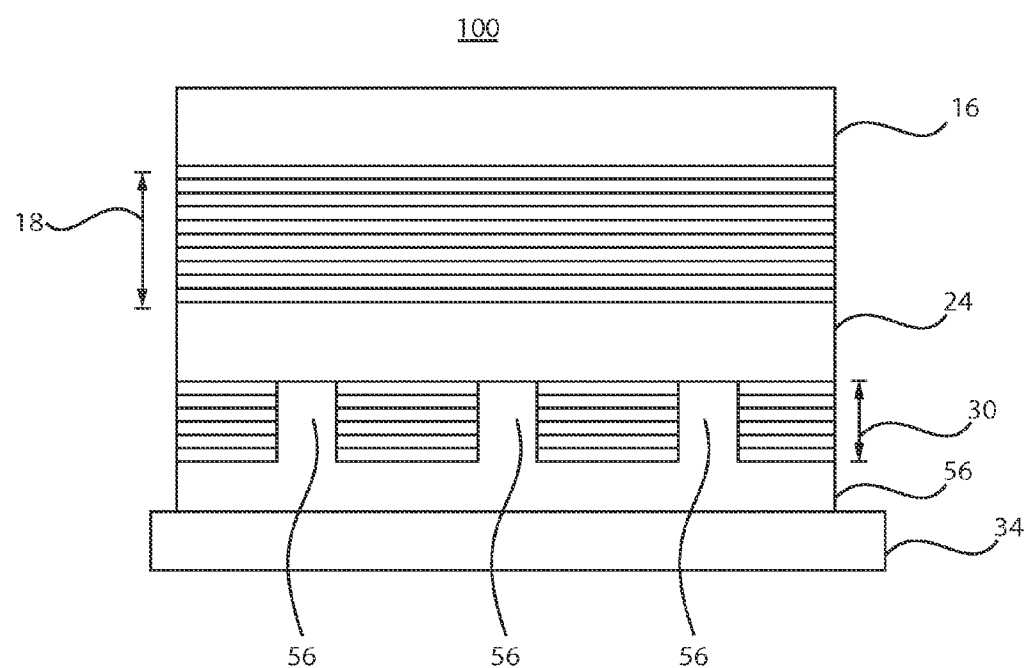
FIG. 9 is a cross-sectional view of the light emitting diode structure of FIG. 8 showing the buffer removed in accordance with the present principles.

Referring to FIG. 9, the device 100 is flipped after removing the growth substrate 12. The buffer layer 14, if employed, is now removed by one or more of etching, polishing, grinding, etc. For a dry etch, a chemical mechanical polishing (CMP) or a chlorine-based chemistry, etc. may be employed to remove the buffer layer 14 (and any remaining portion of the growth substrate 12) down to the contact 16. The stressor layer 56 remains as a portion of the device 100 and acts as a portion of the back contact of the device 100 with localized conductive portions between portions of the reflector(s) 30.

Figure 10:
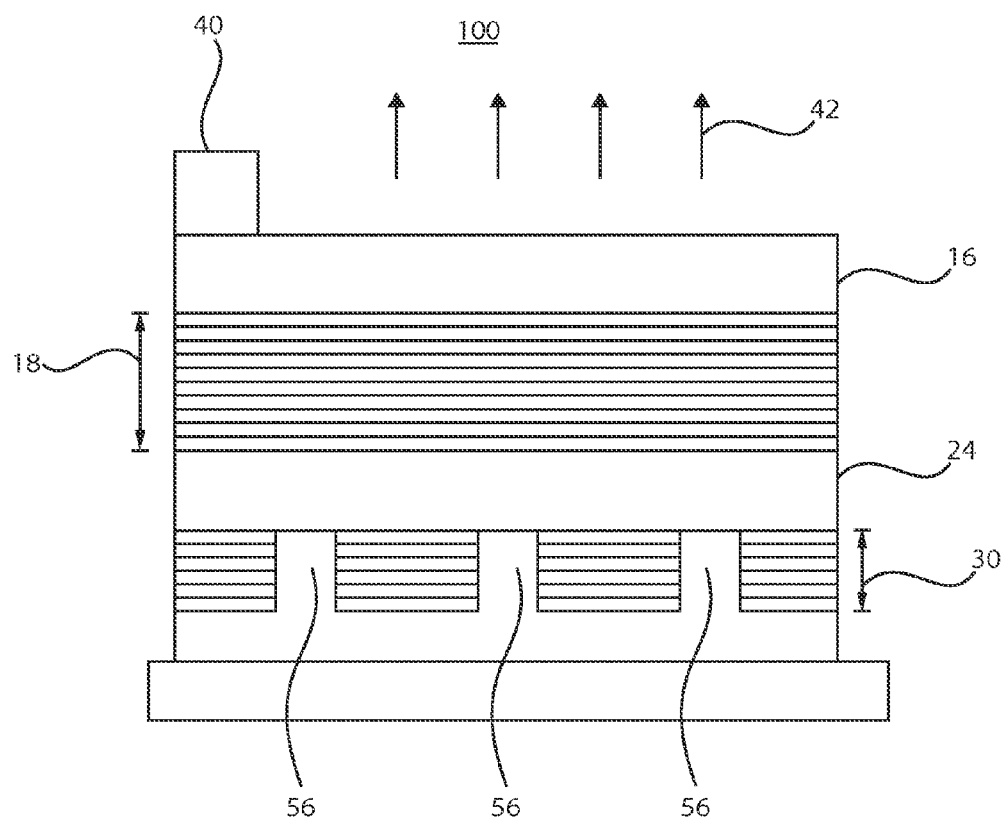
FIG. 10 is a cross-sectional view of the light emitting diode structure of FIG. 9 showing a metal electrode patterned on the LED structure in accordance with the present principles.

Referring to FIG. 10, an optional transparent passivation layer (not shown) may be deposited and patterned. A front metal grid 40 may be deposited and patterned on the contact 16. The metal grid 40 may form a portion of the front contact 16 of the device 100. During operation of the device 100, which includes, an LED or thin LED, light 42 is emitted from the front face (contact 16).

Figure 11:
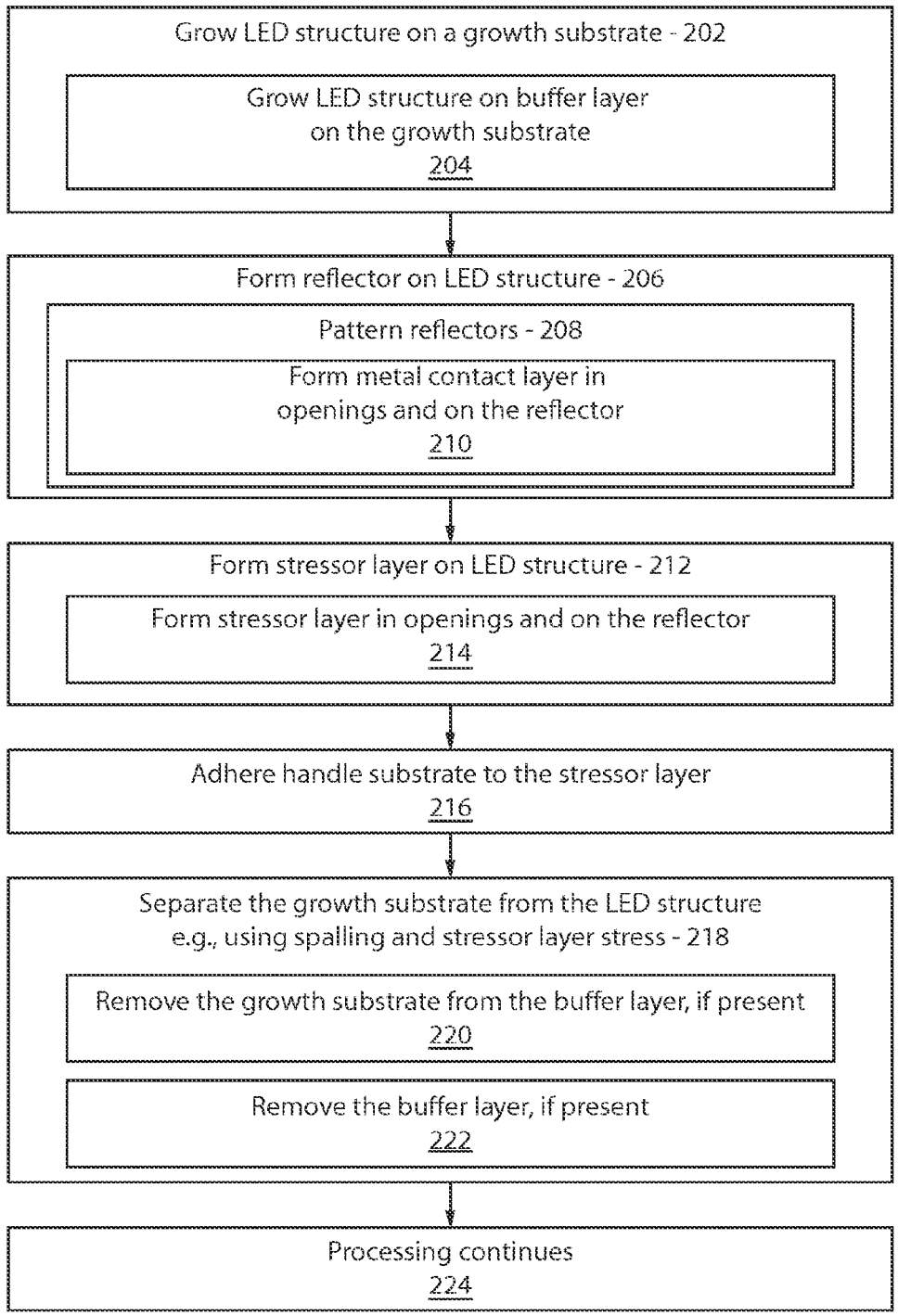
FIG. 11 is a block/flow diagram showing a method for fabricating an LED in accordance with illustrative embodiments.

Referring to FIG. 11, a method for fabricating an LED is shown in accordance with illustrative embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a crystalline LED structure is grown on a growth substrate, e.g., by epitaxial growth. The LED structure may include a multiple quantum well (MQW) structure sandwiched between two contacts with opposite dopants conductivities. In block 204, a crystalline buffer layer may be formed on the growth substrate, and the LED structure may be formed on the buffer layer.

In block 206, alternating material layers are provided on the LED structure to form a reflector on a back side opposite the growth substrate. The alternating material layers may include an epitaxially grown distributed Bragg reflector (DBR) or alternating dielectric layers to form the DBR. In block 208, in one embodiment, the reflector may be patterned to form openings in the reflector. In block 210, a metal contact layer may be formed on or in the patterned reflector.

In block 212, a stressor layer is deposited on the reflector. In block 214, if the reflector is patterned, the stressor layer is formed in the openings to form localized contacts. The localized contacts may contact the LED structure through the reflector (e.g., using the metal contact layer). In block 216, a handle substrate is adhered to the stressor layer.

In block 218, the LED structure is separated from the growth substrate to expose a front side of the LED structure. A spalling process is employed for the layer transfer. The LED structure is separated, e.g., by spalling using stress provided by the stressor layer.

In block 220, if a buffer layer is employed, separating the LED structure may include splitting the growth substrate from the buffer layer. The buffer layer can then be etched to remove the buffer layer from the LED structure in block 222. If the buffer layer is not employed, the split may be made at or near the interface with the LED structure.

In block 224, processing continues. The LED structure may be removed from the stressor layer to transfer the LED to another substrate or device. The LED structure may remain connected to the stressor layer and the handle substrate, and operated in that configuration.

Having described preferred embodiments for thin light emitting diode and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a light emitting diode (LED), comprising:
   growing a crystalline LED structure on a growth substrate;
   forming alternating material layers on the LED structure to form a reflector on a back side opposite the growth substrate;
   depositing a stressor layer on the reflector;
   adhering a handle substrate to the stressor layer; and
   separating the LED structure from the growth substrate using a spalling process to expose a front side of the LED structure.

2. The method as recited in claim 1, further comprising forming a crystalline buffer layer on the growth substrate and forming the LED structure on the buffer layer.

3. The method as recited in claim 2, wherein separating the LED structure includes splitting the growth substrate from the buffer layer and etching the buffer layer to remove the buffer layer form the LED structure.

4. The method as recited in claim 1, wherein forming alternating material layers includes epitaxially growing distributed Bragg reflectors (DBR).

5. The method as recited in claim 1, wherein forming alternating material layers includes depositing alternating dielectric layers to form distributed Bragg reflectors (DBR).

6. The method as recited in claim 1, wherein separating the LED structure includes spalling the growth substrate by employing stress provided by the stressor layer.

7. The method as recited in claim 1, wherein the LED structure includes a multiple quantum well (MQW) structure.

8. The method as recited in claim 1, wherein the LED structure includes GaN.

9. A method for fabricating a light emitting diode (LED), comprising:
   growing a crystalline LED structure on a growth substrate;
   forming alternating material layers on the LED structure to form a reflector on a back side opposite the growth substrate;
   patterning the reflector to form openings in the reflector;
   depositing a stressor layer on the reflector and in the openings to form localized contacts;
   adhering a handle substrate to the stressor layer; and
   separating the LED structure from the growth substrate using a spalling process to expose a front side of the LED structure.

10. The method as recited in claim 9, further comprising forming a crystalline buffer layer on the growth substrate and forming the LED structure on the buffer layer.

11. The method as recited in claim 10, wherein separating the LED structure includes splitting the growth substrate from the buffer layer and etching the buffer layer to remove the buffer layer form the LED structure.

12. The method as recited in claim 9, wherein forming alternating material layers includes epitaxially growing distributed Bragg reflectors (DBR).

13. The method as recited in claim 9, wherein forming alternating material layers includes depositing alternating dielectric layers to form distributed Bragg reflectors (DBR).

14. The method as recited in claim 9, wherein separating the LED structure includes spalling the growth substrate by employing stress provided by the stressor layer.

15. The method as recited in claim 9, wherein the LED structure includes a multiple quantum well (MQW) structure.

16. The method as recited in claim 9, wherein the localized contacts contact the LED structure through the reflector.

\* \* \* \* \*